United States Patent [19]
Cross et al.

[11] Patent Number: 5,142,186
[45] Date of Patent: Aug. 25, 1992

[54] SINGLE CRYSTAL DOMAIN DRIVEN BENDER ACTUATOR

[75] Inventors: Leslie E. Cross, State College, Pa.; Wuyi Pan, Socorro, N. Mex.; Qiming Zhang, Upton, N.Y.

[73] Assignee: United States of America as Represented by the Secretary of the Air Force, Washington, D.C.

[21] Appl. No.: 740,525

[22] Filed: Aug. 5, 1991

[51] Int. Cl.[5] .............................................. H01L 41/08
[52] U.S. Cl. .................................... 310/332; 310/330; 310/358; 310/360
[58] Field of Search ................................ 310/330–332, 310/357–359, 360, 311

[56] References Cited

U.S. PATENT DOCUMENTS

| | | | |
|---|---|---|---|
| 1,802,780 | 4/1931 | Sawyer | 310/330 X |
| 2,633,543 | 3/1953 | Howatt | 310/9.8 |
| 2,659,829 | 11/1953 | Baerwald | 310/330 |
| 2,756,353 | 7/1956 | Samsel | 310/330 |
| 3,732,549 | 5/1973 | Barkely | 340/173.2 |
| 3,782,806 | 1/1974 | Barkely et al. | 350/149 |
| 4,109,359 | 8/1978 | Cross et al. | 29/25.35 |
| 4,333,842 | 6/1982 | Ito et al. | 252/62.9 |
| 4,491,761 | 1/1985 | Grudkowski et al. | 310/359 |
| 4,524,294 | 6/1985 | Brody . | |
| 4,714,848 | 12/1987 | Chen | 310/359 |
| 4,862,029 | 8/1989 | Kasai et al. | 310/330 X |

FOREIGN PATENT DOCUMENTS 0139370  6/1987  Japan .................................... 310/330

OTHER PUBLICATIONS

Domain Structures and Phase Transitions in Barium Titanate, P. W. Forsbergh, Jr. Oct. 15, 1949.
Notes, Physical Constants, Apparent, Ionization Constants (250), vol. 76.

Primary Examiner—Mark O. Budd
Attorney, Agent, or Firm—Bobby Scearce; Donald J. Singer

[57] ABSTRACT

A single crystal bender actuator for selectively positioning a movable precision optical or acoustical component is described which comprises a single crystal of barium titanate, barium strontium titanate, barium lead titanate, potassium niobate tantalate, lead titanate-lead magnesium niobate or other material in which a special domain structure can be induced to produce a very high strain bimorph configuration, the single crystal operatively interconnecting support structure and the movable component, and means for selectively applying an electric field of controllable field strength to the crystal.

3 Claims, 2 Drawing Sheets

SINGLE CRYSTAL DOMAIN DRIVEN BENDER ACTUATOR

RIGHTS OF THE GOVERNMENT

The invention described herein may be manufactured and used by or for the Government of the United States for all governmental purposes without the payment of any royalty.

BACKGROUND OF THE INVENTION

The present invention relates generally to actuators for optical and acoustical devices and more particularly to a single crystal bimorph actuator for selective positioning of precision optical or acoustical components.

Mirrors, lenses and other optical components included in a precision optical system may require fine adjustments in order to achieve the precision alignment required for proper functioning of the optical system. Precision acoustical components such as sonar sensors may also require sensitive positioning capability. Deformable or segmented morrors may be subject to substantial outside forces tending to impair the utility thereof in precision applications such as laser generation and transmission, ranging and telemetry devices or the like. Severe thermal or pressure induced stresses on deformable or segmented optical components may require that means be provided adjacent the component to selectively modify the shape of the reflective or refractive surface in a controlled manner to preserve the contour thereof.

The invention provides an actuator for selective positioning of an optical or acoustical component or in controlling the shape of a deformable or segmented component whereby the shape of the component may be preserved against thermal or pressure induced stress. The invention comprises a single crystal of barium titanate or other material demonstrating a special domain structure which produces a high strain bimorph configuration, the shape of the crystal being controllable by selective application of an electric field.

It is therefore a principal object of the invention to provide an actuator for selectively controlling with precision the position of an optical or acoustical component or in controlling the shape of a deformable or segmented component.

It is a further object of the invention to provide a single crystal deformable actuator.

These and other objects of the invention will become apparent as a detailed description of representative embodiments proceeds.

SUMMARY OF THE INVENTION

In accordance with the foregoing principles and objects of the invention, a single crystal bimorph actuator for selectively positioning a movable precision optical or acoustical component is described which comprises a single crystal of barium titanate, barium strontium titanate, barium lead titanate, potassium niobate tantalate, lead titanate-lead magnesium niobate or other material in which a special domain structure can be induced to produce a very high strain bimorph configuration, the single crystal operatively interconnecting support structure and the movable component, and means for selectively applying an electric field of controllable field strength to the crystal.

DESCRIPTION OF THE DRAWINGS

The invention will be more clearly understood from the following detailed description of representative embodiments thereof read in conjunction with the accompanying drawings wherein.

DETAILED DESCRIPTION

Figure 1:
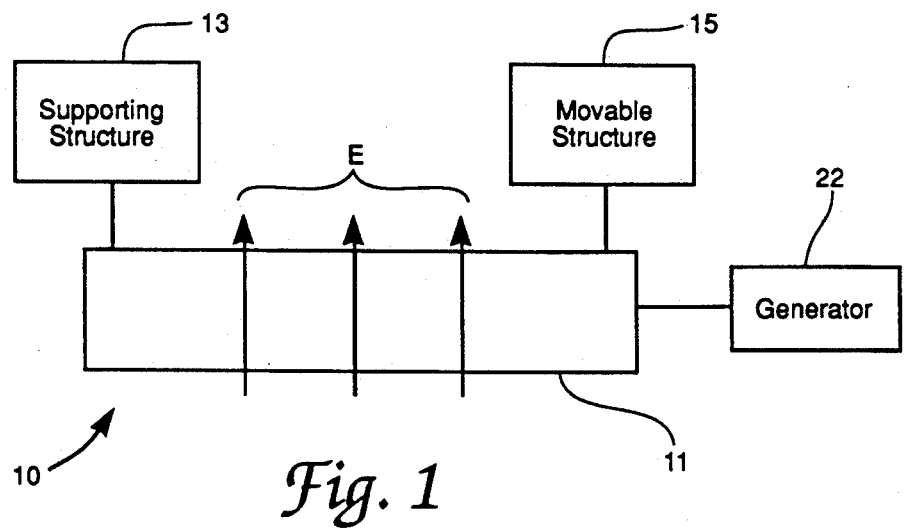
FIG. 1 is a schematic of the component parts of a representative embodiment of the invention.

Referring now to the drawings, FIG. 1 is a block diagram of the component parts of representative actuator 10 of the invention. In accordance with a governing principle of the invention, actuator 10 includes crystal 11 which may interconnect a supporting structure 13 and movable structure or element 15, such as a movable lens, mirror segment, sonar sensor, tunnel contact control, force microscope control, photoresist mask alignment, microphone driver relay, or other optical or acoustical component requiring fine positioning or alignment capability. Crystal 11 has a special domain structure inducible in single crystals of certain materials to produce a high strain bimorph configuration. Materials in which this configuration may be induced may include single crystals of barium titanate ($BaTiO_3$), barium strontium titanate (($Ba_{1-x}Sr_x)TiO_3$), barium lead titanate (($Ba_{1-x}Pb_x)TiO_3$), potassium niobate tantalate ($K(Nb_{1-x}Ta_x)O_3$), lead titanate-lead magnesium niobate (($PbTiO_3)_{1-x}(PbMg_{\frac{1}{3}}Nb)_{\frac{2}{3}})_x$), or other similar material occurring to the skilled artisan guided by these teachings. This domain structure was first observed in single crystals of barium titanate in the tetragonal ferroelectric phase by Forsbergh (Phys Rev 76: 1187-1201 (1949)), the teachings of which are incorporated by reference herein. Single crystals of barium titanate most useful in the invention have thickness of about 0.1 to 2 mm and may be grown from a flux of potassium fluoride by the Remeika method (J Am Chem Soc 76:940 (1954)). Plate-like crystals which grow near the surface of the melt in the Remeika process often exhibit an impurity gradient across the thickness thereof and lead to upper and lower crystal surfaces having slightly different lattice dimensions. The gradient is attributed to impurity levels of about 0.4% platinum acquired from the crucible in which the crystals are grown, the impurity gradient being about 4%/mm and the impurity level ranging from about 0–5000 ppm on one side of the crystal to about 20,000 to 40,000 ppm near the other side. In the cubic phase above the critical temperature $T_c$ (125° C., the cubic to tetragonal phase transition temperature), the impurity gradient across the thickness of the crystal results in a weak curvature of the plate in a lens shape as suggested in FIG. 2 (from Forsbergh). Just below $T_c$, domains nucleate in the curved crystal in a configuration such that stresses associated with the curvature are relieved. Triangular segments of narrow wedge shaped domains 17 such as those shown in FIG. 2 occur in such manner that the longer c axis of the tetragonal structure of the domains are dominantly in expanded surface 19 of crystal 11, and the shorter a axis of the structure is in contracted surface 20. The twinned structure suggested in FIG. 2 first appears at a temperature near $T_c$ where the ratio c/a is small, and on cooling to room temperature the configuration originally appearing to relieve stress resulting from the impurity gradient described above results in a much larger curvature.

Figure 3:
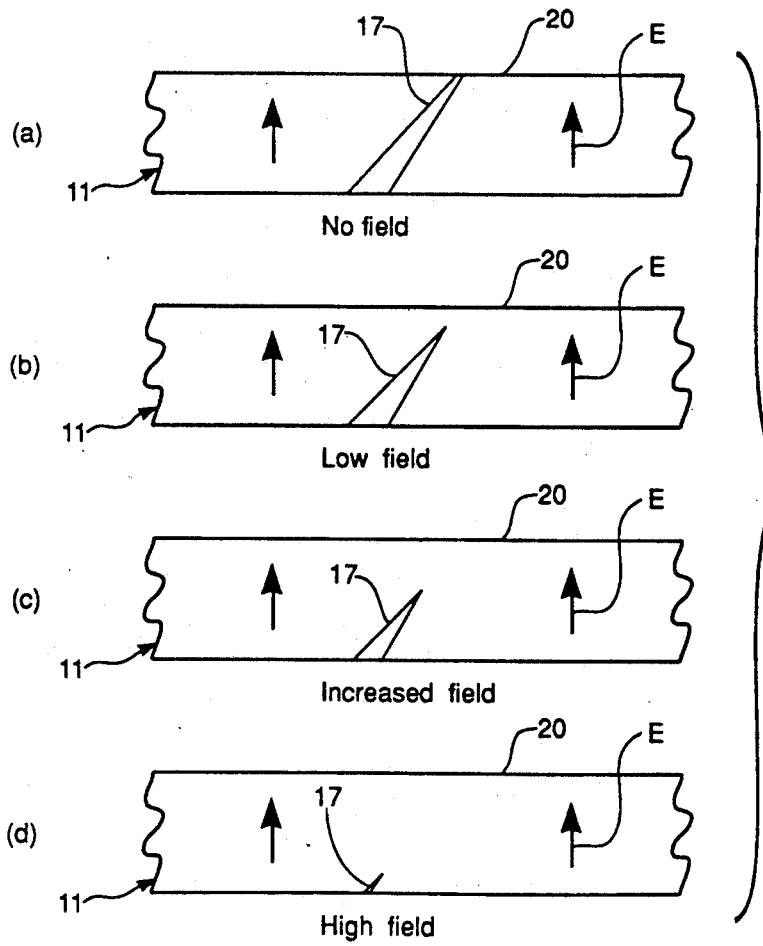
FIG. 3 illustrates the stages of shrinking of the domains by the application of an electric field.

The curvature of crystal 11 resulting from the presence of 90° wedge shaped domains 17 may be controlled by the application of an electric field; a field applied along the c axis of crystal 11 causes a wedge shaped domain 17 to contract (Fousek et al, Bull Acad Sci, USSR Phys Ser 28:624 (1965)). FIG. 3 shows qualitatively the relative size of a domain 17 under no applied field E (FIG. 3a), under high applied field strength (FIG. 3d) and two intermediate field strengths (FIGS. 3b,c). The lengthening and shortening of domains 17 under the influence of field E result from contraction and expansion of the a axis oriented region near contracted surface 20. The contraction/expansion of domains 17 are reversible under the applied field; a high field strength substantially eliminates all domains 17, and the domains reappear upon removal of the field. Referring again to FIG. 1, fine adjustments in position of element 15 may be made by selective control of electric field generating means 22 operatively connected to crystal 11. Typical electric field generating means 22 may include a controllable battery, DC power supply or AC generator voltage system. For crystals 11 about 0.1 to 0.2 mm thick, field strengths up to about 20 KV/cm result in selective shrinking of domains 17 and consequent reversible strain on crystal 11 as discussed more fully below.

Figure 2:
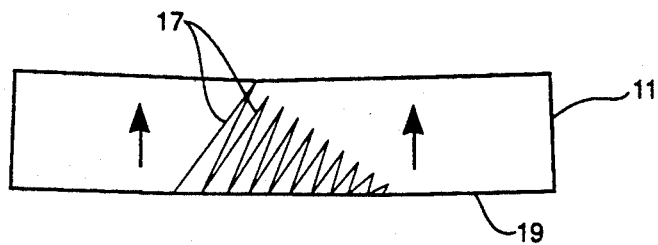
FIG. 2 illustrates a crystal of the invention having domains therein producing curvature.
Figure 4:
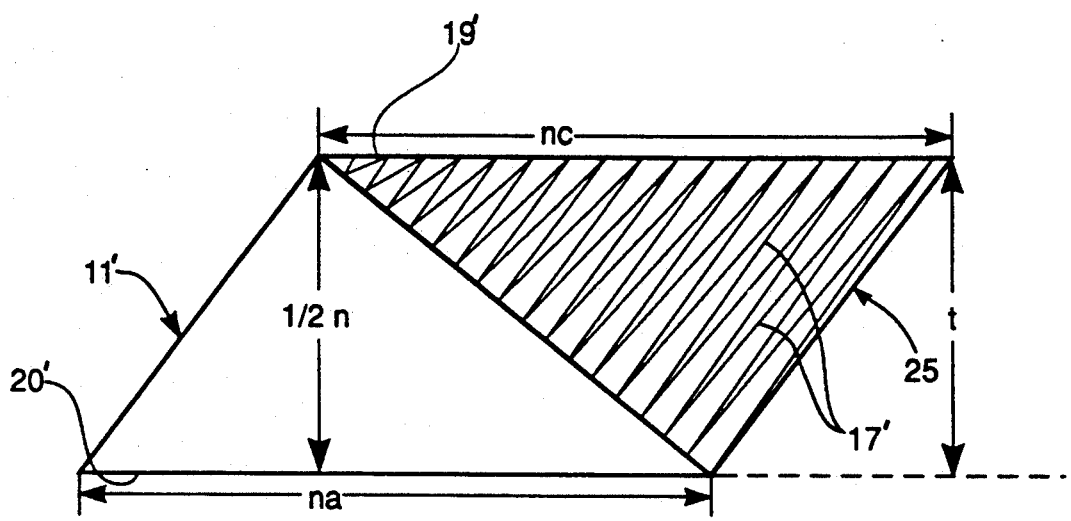
FIG. 4 illustrates a single element of a Forsbergh domain crystal.
Figure 5:
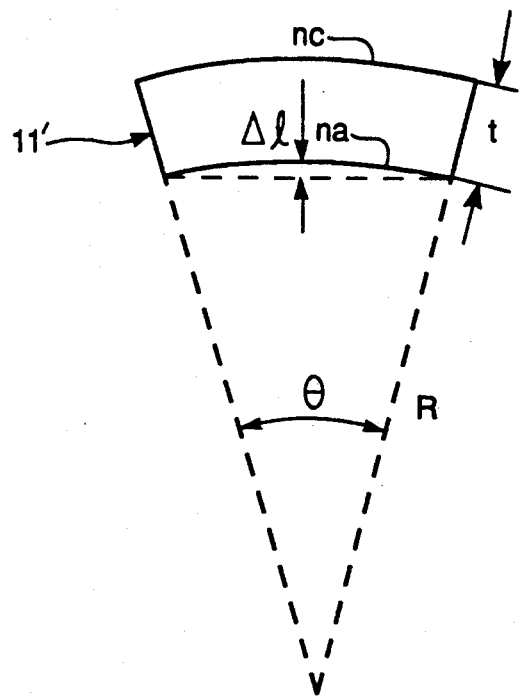
FIG. 5 illustrates the parameters of curvature of a Forsbergh domain crystal.

Referring now to FIG. 4, shown therein is a schematic of a single element of a twinned crystal 11' containing a plurality of wedge shaped domains 17' defining a twinned wedge 25. Given that wedge 25 is n unit cells in length, its length along (upper) expanded surface 19' is nc and along (lower) contracted surface 20' is na, where c and a are the axial lengths of the tetragonal twinned crystal, the difference in lengths of wedge 25 at the respective surfaces 19',20' resulting in the curvature of crystal 11' (FIG. 2). Referring now to FIG. 5, illustrated therein is the resulting radius of curvature R of crystal 11'. If crystal 11' has thickness t, the respective lengths nc,na of wedge 25 are, $$n = (R+t)\theta$$

$$na = R\theta$$

Since t equals nc/2, $\theta$ and R may be expressed by, $$\theta = 2(c-a)/c$$

$$R = nca/2(c-a)$$

The rise $\Delta l$ in the center of crystal 11' is, $$\Delta l = R\theta^2/8 = (i\ c-a)n/4$$

If crystal 11' comprises a linear chain of N Forsbergh units of FIG. 4, R remains the same, but $\theta$ is $2N(c-a)/c$ and $\Delta l$ is, $$\Delta l = (c-a)nN^2/4$$

If N is 10 and the total crystal length is 2 mm, t is 0.1 mm. For $BaTiO_3$, the value of (c/a−1) at 25° C. is 0.008, and $\Delta l$ equals 40 microns. Through the application then of an electric field of suitable strength (to about 20 KV/cm) along the c axis, the volume of a oriented twins 25 can be reduced by 50%, resulting in $\Delta l$ equal to 20 microns, and a strain level of about $10\mu$/mm ($10^{-2}$).

The invention therefore provides a single crystal actuator for selectively positioning an optical or acoustical component. It is understood that modifications to the invention may be made as might occur to one with skill in the field of the invention within the scope of the appended claims. All embodiments contemplated hereunder which achieve the objects of the invention have therefore not been shown in complete detail. Other embodiments may be developed without departing from the spirit of the invention or from the scope of the appended claims.

We claim:

1. A single crystal bender actuator for selectively positioning a movable optical or acoustical component, comprising:
    (a) support structure;
    (b) a single crystal of material having a tetragonal structure below a characteristic transition temperature, said tetragonal structure having a domain structure inducible therein characterized by a high strain bimorph configuration, said crystal structurally interconnecting said support structure and said movable component; and
    (c) means for selectively applying an electric field of controllable field strength to said crystal.

2. The actuator of claim 1 wherein said crystal has thickness of 0.1 to 2 mm.

3. The actuator of claim 1 wherein said single crystal comprises a material selected from the group consisting of barium titanate ($BaTiO_3$), barium strontium titanate (($Ba_{1-x}Sr_x)TiO_3$), barium lead titanate (($Ba_{1-x}Pb_x$)$TiO_3$), potassium niobate tantalate ($K(Nb_{1-x}Ta_x)O_3$), and lead titanate-lead magnesium niobate (($PbTiO_3)_{1-x}(PbMg_{166}Nb_{174})_x$).

* * * * *

UNITED STATES PATENT AND TRADEMARK OFFICE
CERTIFICATE OF CORRECTION

PATENT NO. : 5,142,186

DATED : August 25, 1992

INVENTOR(S) : Leslie E. Cross, et. al.

It is certified that error appears in the above-identified patent and that said Letters Patent is hereby corrected as shown below:

Column 2, line 37, "1/4" should be --2/3--.

Column 2, line 55, "4%" should be --0.04%--.

Column 4, line 53, "$(PbMg_{166}Nb_{174})_x$" should be --$(PbMg_{1/3}Nb_{2/3})_x$--.

Signed and Sealed this

Twenty-eighth Day of September, 1993

Attest:

BRUCE LEHMAN

*Attesting Officer*     *Commissioner of Patents and Trademarks*